US010721841B2

(12) United States Patent
Wu (10) Patent No.: US 10,721,841 B2
(45) Date of Patent: Jul. 21, 2020

(54) HEART DISSIPATOR STRUCTURE

(71) Applicants: Chia-Sheng Wu, New Taipei (TW); Yu Qin Technology, Ltd, New Taipei (TW)

(72) Inventor: Chia-Sheng Wu, New Taipei (TW)

(73) Assignee: YU QIN TECHNOLOGY, LTD., New Taipei (TW)

( * ) Notice: Subject to any disclaimer, the term of this patent is extended or adjusted under 35 U.S.C. 154(b) by 463 days.

(21) Appl. No.: 15/196,910

(22) Filed: Jun. 29, 2016

(65) Prior Publication Data

US 2018/0007811 A1    Jan. 4, 2018

(51) Int. Cl.
*H05K 7/20* (2006.01)
*H01L 23/467* (2006.01)
*H01L 23/40* (2006.01)

(52) U.S. Cl.
CPC ..... *H05K 7/20509* (2013.01); *H01L 23/4006* (2013.01); *H01L 23/467* (2013.01); *H01L 23/40* (2013.01); *H01L 2023/4037* (2013.01); *H01L 2023/4068* (2013.01)

(58) Field of Classification Search
CPC ................ H01L 23/4006; H01L 23/40; H01L 2023/4037; H01L 2023/4068; H01L 23/467; H05K 7/20509
See application file for complete search history.

(56) References Cited

U.S. PATENT DOCUMENTS

| 5,700,167 A * | 12/1997 | Pharney | H05K 1/0228 439/676 |
| 5,963,428 A * | 10/1999 | Salmonson | H01L 23/04 165/185 |
| 6,188,579 B1 * | 2/2001 | Buondelmonte | H01L 23/3677 257/707 |
| 7,896,597 B2 * | 3/2011 | Hu | F16B 5/0275 411/168 |

(Continued)

OTHER PUBLICATIONS

Fatigue and Fracture Mechanics Analysis of Threaded Connections; Feargal Peter Brennan; Department of Mechanical Engineering; University College London (Year: 1992).*

*Primary Examiner* — Gordon A Jones
(74) *Attorney, Agent, or Firm* — Muncy, Geissler, Olds & Lowe, P.C.

(57) ABSTRACT

A heat dissipator structure includes a heat-dissipation base and a conductive metal block. The heat-dissipation base includes a substrate and a plurality of heat-dissipating fins disposed on the substrate. A receiving portion and a limit sliding block are disposed on the substrate, with the limit sliding block disposed on the receiving portion and movable within a restrictive interval. The conductive metal block includes a body portion, an assembling portion disposed beside the body portion, and a heat dissipation plane disposed on the body portion to face away from the assembling portion and be in contact with an electronic component, with the assembling portion disposed on the receiving portion, a positioning slot disposed on the assembling portion to hold (Continued)

the limit sliding block laterally and keep the heat dissipation plane flat, and at least one resilient unit disposed between the assembling portion plane and the receiving portion plane to provide resilient support to the conductive metal block.

11 Claims, 10 Drawing Sheets

(56) References Cited

U.S. PATENT DOCUMENTS

| | | | | |
|---|---|---|---|---|
| 2008/0239678 | A1* | 10/2008 | Ploeg | H01L 23/40 |
| | | | | 361/719 |
| 2011/0100595 | A1* | 5/2011 | Liu | F16B 5/0266 |
| | | | | 165/67 |
| 2014/0000855 | A1* | 1/2014 | Xia | H01L 23/4006 |
| | | | | 165/185 |
| 2014/0035118 | A1* | 2/2014 | Bayerer | H01L 23/049 |
| | | | | 257/690 |
| 2015/0077932 | A1* | 3/2015 | Chai | G06F 1/20 |
| | | | | 361/679.54 |
| 2016/0227667 | A1* | 8/2016 | Ramones | F28F 13/00 |
| 2017/0330818 | A1* | 11/2017 | Yamagishi | H01L 23/29 |
| 2018/0098421 | A1* | 4/2018 | Cai | H01L 23/4006 |

* cited by examiner

HEART DISSIPATOR STRUCTURE

BACKGROUND OF THE INVENTION

1. Technical Field

The present invention relates to a heat dissipator structure, especially to a heat dissipator structure having resiliently contacting electronic components.

2. Description of Related Art

Nowadays, electronic products are sought to have more varieties of function and fast performance, so forth. However, this has caused the electronic products to have complex operation and produce lots of heat, which cannot disperse rapidly. The heat continuously accumulates in the electronic products before the dispersion may lead the temperature of the electronic products increased. Under the effect of high temperature, the electronic products will have abnormal operation like low operation speed or shut down because of overheat. For a long period of time, the components of electronic products are hound to have damage and overload, which reduces the life time of the electronic products. Thus, in order to solve the problems of electronic products damage by overheat, a heat dissipator is generally disposed near the surroundings of the high heat-producing components for improving the heat dissipation.

SUMMARY OF THE INVENTION

General heat dissipators utilize the heat conductivity of a plurality of metal fins to achieve dissipating and avoid the heat accumulation. Some of the heat dissipators are disposed with fans to drive the air flow, and then the heat dissipation can be accelerated by air cooling effect. Furthermore, in order to solve the high temperature instantly produced by the electronic components, the heat dissipators are disposed with good conductivity metal sheets, which can accelerate the heat dissipation speed before the heat accumulation and avoid the temperature continuously increasing to affect the normal operation of electronic product. Nevertheless, the inventors of the present invention consider that the metal sheets are disposed by the general means, such as using screw or latch, which cannot keep the metal sheets flat and cause the problems of reducing the conductivity area and damaging the components. Thus, the inventors of the present invention consider that there is a necessary to solve the problem of the conventional techniques mentioned above for the heat dissipator to enhance its heat dissipation efficacy.

BRIEF DESCRIPTION OF THE DRAWINGS

The accompanying drawings, together with the specificaion, illustrate exemplary embodiments of the present invention, and, together with the description, serve to explain the principles of the present invention.

DETAILED DESCRIPTION OF THE INVENTION

The object of the present invention is to solve the problem of unable to keep the metal sheets flat by conventional techniques, which leads to the problems of affecting the heat dissipation efficacy and damaging the electronic components.

For the purpose of solving the problems mentioned above, the present invention provides a heat dissipator structure, comprising: a heat-dissipating base including a substrate and a plurality of heat-dissipating fins disposed on the substrate, wherein a receiving portion and a limit sliding block are disposed on the substrate, with the limit sliding block disposed on the receiving portion and movable within a restrictive interval; and a conductive metal block including a body portion, an assembling portion disposed beside the body portion, and a heat dissipation plane disposed on the body portion to face away from the assembling portion and be in contact with an electronic component, with the assembling portion disposed on the receiving portion, an unpenetrable object means disposed on the assembling portion to hold the limit sliding block laterally and keep the heat dissipation plane flat, and at least one resilient unit disposed between the assembling portion plane and the receiving portion plane to provide resilient support to the conductive metal block.

In a preferable embodiment, the unpenetrable object means is a positioning slot for riveting the limit sliding block laterally.

In a preferable embodiment, the heat-dissipating base includes a through hole disposed on the receiving portion, whereas the limit sliding block includes a sliding block body adapted to pass through the through hole, a top protruding portion disposed at the sliding block body and confined to a side of the substrate, and a riveting portion disposed on the sliding block body to face away from the top protruding portion and be riveted into the positioning slot.

In a preferable embodiment, an abutting recess is disposed on a side of the through hole of the heat-dissipating base to engage with the top protruding portion.

In a preferable embodiment, the positioning slot includes a fixing recess and an external circumferential recess disposed on the fixing recess and being of a larger inner diameter than the fixing recess, whereas the riveting portion includes a deforming segment of an outer diameter less than the external circumferential recess but larger than the fixing recess to interfere with the fixing recess and a positioning segment of an outer diameter smaller than the inner diameter of the fixing recess so as to be inserted into the fixing recess.

In a preferable embodiment, an annular groove is disposed between the deforming segment and the positioning segment and opened outward to allow the deforming segment to be riveted into the fixing recess.

In a preferable embodiment, the resilient unit includes at least one unpenetrable object means disposed on the assembling portion, at least one support post with an end thereof disposed at the unpenetrable object means, and at least one resilient component disposed on the at least one support post, respectively.

In a preferable embodiment, at least one limit slot is disposed on the receiving portion to correspond in position to the at least one support post and admit an end of the at least one support post, respectively.

In a preferable embodiment, a conductive material is disposed at the at least one of the unpenetrable object means, the at least one limit slot, and/or the receiving portion.

In a preferable embodiment, the resilient unit includes at least one unpenetrable object means disposed on the receiving portion, at least one support post with an end thereof disposed at the impenetrable object means, and at least one resilient component disposed on the at least one support post, respectively.

In a preferable embodiment, at least one limit slot is disposed on the assembling portion to correspond in position to the at least one support post and admit an end of the at least one support post, respectively.

Further, a conductive material is disposed at the at least one of the unpenetrable object means, the at least one limit slot, and/or the receiving portion.

In a preferable embodiment, the at least one resilient unit is disposed at the at least one of four corners of the conductive metal block.

In a preferable embodiment, at least one metallic conductive post is disposed between the assembling portion plane and the receiving portion plane to enhance conductivity.

In a preferable embodiment, the assembling portion is smaller than the body portion such that a first level difference is defined between the assembling portion and the body portion, wherein an enclosing wall is disposed at a periphery of the receiving portion of the substrate to protrude relative to the receiving portion such that a second level difference is defined between the enclosing wall and the receiving portion, thereby allowing a position of the assembling portion to be limited by the first level difference and the second level difference jointly.

To sum up, the present invention has the following advantages comparing to the conventional techniques:

1. The present invention utilizes riveting the limit sliding block to fix the conductive metal block on the heat-dissipating base, for keeping the metal sheet flat and avoiding the problem of damaging electronic components.

2. The present invention utilizes the arrangement of the limit sliding block and the resilient unit for the heat dissipation plane resiliently contacting electronic components, which increases the contacting area of heat dissipation plane and electronic components and avoids the problem of tolerance.

Embodiment

For the detailed description of the present invention and technical content, now the present invention is to be described with the accompanying drawings below. Moreover, the present invention in the drawings, for ease of illustration, not necessarily according to their proportion of the actual scale, the proportion of drawings and are not intended to limit the scope of the utility model.

Figure 1:
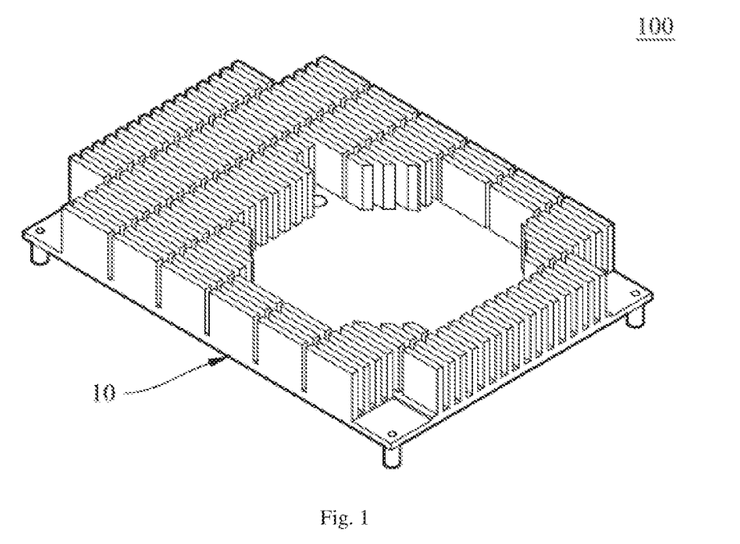
FIG. 1 shows the three-dimensional appearance (1) of the heat dissipator structure of the present invention.
Figure 2:
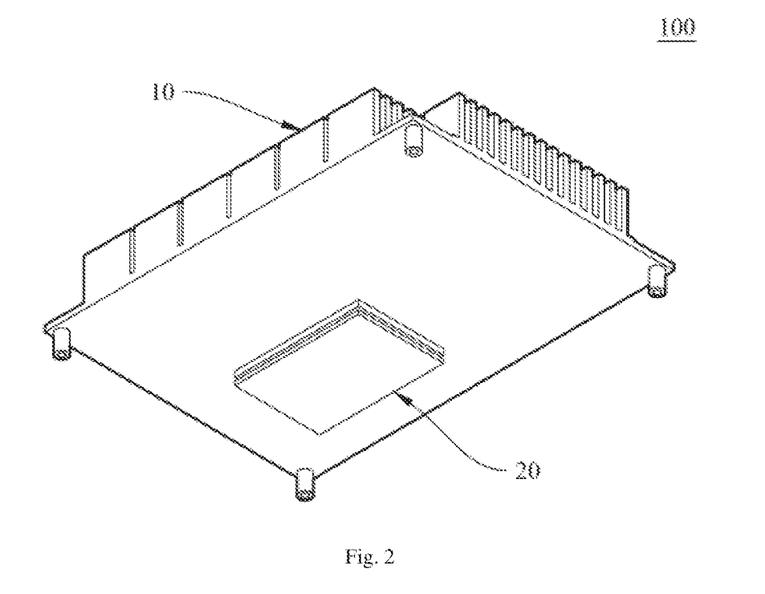
FIG. 2 shows the three-dimensional appearances (2) of the heat dissipator structure of the present invention.

The following is a preferred embodiment of the present invention for detailed description. Please refer to FIG. 1 and FIG. 2, which are the three-dimensional appearances of the heat dissipator structure of the present invention, as shown:

The present embodiment discloses a heat dissipator structure 100, mainly comprising: a heat-dissipating base 10 and a conductive metal block 20; and the heat dissipator structure 100 can be disposed beside the surroundings of high-temperature-producing electronic components (not shown in drawing), for the advantage of the heat dissipation of the electronic components during operation.

Figure 3:
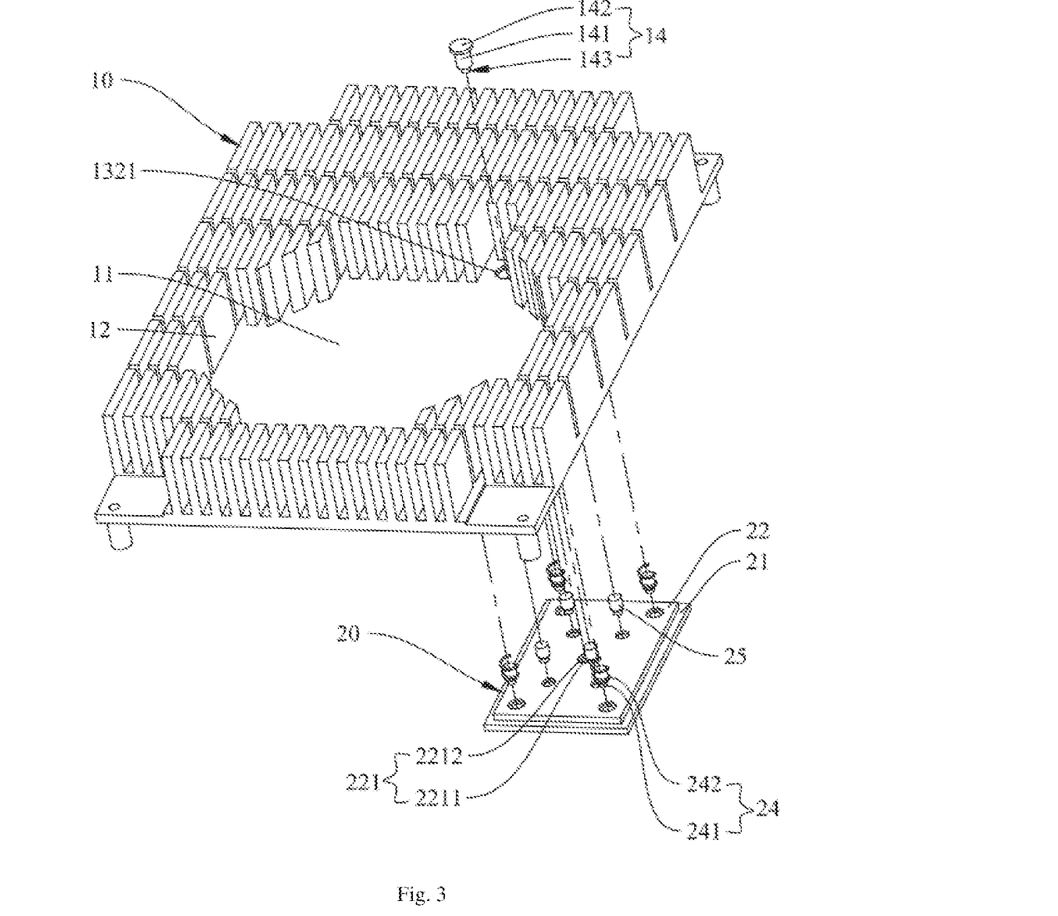
FIG. 3 shows the exploded perspective view (1) of the heat dissipator structure of the present invention.
Figure 4:
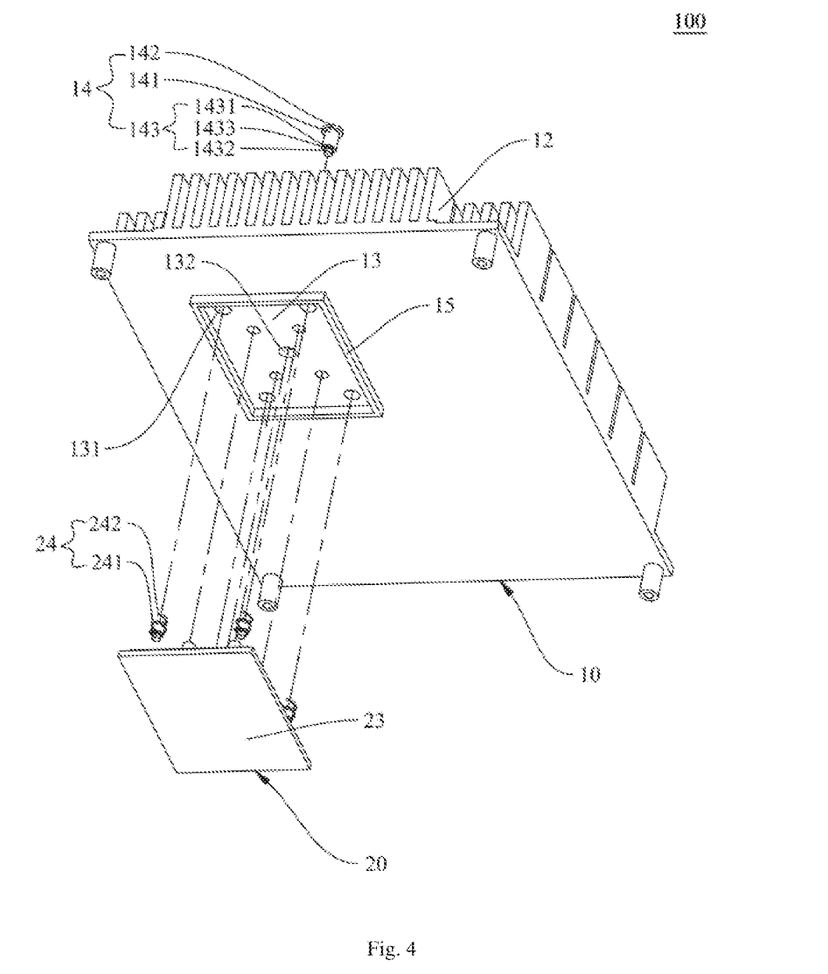
FIG. 4 shows the exploded perspective view (2) of the heat dissipator structure of the present invention.

Please also refer to FIG. 3 and FIG. 4, which are respectively represented the exploded perspective views of the heat dissipator structure of the present invention.

In the present invention, the heat-dissipating base 10 includes a base 11 and a plurality of heat-dissipating fins 12. The heat-dissipating fins 12 are disposed with intervals respectively on the base 11 for increasing the heat dissipating area of the heat-dissipating base 10. The base 11 are disposed with a receiving portion 13 and a limit sliding block 14. The limit sliding block 14 is disposed on a restrictive interval of the receiving portion 13 for limited movement.

In the present invention, the conductive metal block 20 includes a body portion 21, an assembling portion 22, and a heat dissipation plane 23. The assembling portion 22 is disposed on a side of the body portion 21, and the heat dissipation plane 23 is disposed on the body portion 21 to face away front the assembling portion 22 and be in contact with the electronic components, which has the advantage for the conductive metal block 20 to absorb the heat produced by the electronic component and to conduct the heat to the heat-dissipating base 10, for its heat-dissipating fins 12 to dissipate the heat. The assembling portion 22 is disposed on the receiving portion 13, and an unpenetrable object means is disposed on the assembling portion 22 to hold the limit sliding block 14 laterally and keeps the heat dissipation plane 23 flat. The unpenetrable object means can be groove locking screw, welding, riveting, or any other means that does not penetrate the conductive metal block 20 to keep the heat dissipation plane 23 flat, with no limitation in the present invention. The term "flat" mentioned above is no penetration to the conductive metal block 20 to avoid the heat dissipation plane 23 having concave or convex structure. The present embodiment is to disclose that the unpenetrable object means provides a positioning slot 221 for riveting the limit sliding block 14 laterally, and the way of riveting enhances the adaptation of limit sliding block 14 and conductive metal block 20, increasing the heat dissipating efficacy.

In a preferred embodiment, the assembling portion 22 of the conductive metal block 20 is smaller than the body portion 21 such that a first level difference is defined between the assembling portion 21 and the body portion 21. The periphery of the receiving portion 13 of the substrate 11 disposes an enclosing wall 15 protruded relatively to the receiving portion 13, such that a second level difference is defined with the receiving portion 13. The first level difference of the assembling portion 22 and the second level difference of the receiving portion 13 are jointly arranged to limit the position of the assembling portion 22, such that the side movement of the conductive metal block 20 relative to the heat-dissipating base 10 can be limited.

In the present invention, at least one resilient unit 24 is disposed between the assembling portion 22 and the heat dissipation 13 for providing resilient support to the conductive metal block 20 and as to conduct heat, so that the conductive metal block 20 can adjust elastically relative to the heat-dissipating base 10. In a preferred embodiment, the resilient unit 24 is disposed at the four corners of the conductive metal block, such that the conductive metal block 20 can move steady relative to the heating-dissipating base 10. The position and amount of the resilient unit 24 to be disposed can be planned and exploited by the need and practical application effect of the producer, with no limitation in the present invention.

The following two embodiments are for the description of the disposing structure of the resilient unit in the present invention. However, the present invention cannot be limited from the following embodiments.

Embodiment 1

In the present embodiment, the resilient unit 24 includes at least one unpenetrable object means disposed on the assembling portion 22, at least one support post 241, and at least one resilient component 242 disposed on the at least one support post 241; and an end of the support post 241 is disposed at the unpenetrable object means of the assembling portion 22. The resilient component 242 can be spring, shrapnel or any other elements having stretch rebound effect without limitation. For limiting the position of the support post 241 and increasing the contacting area of the receiving portion 13 and the support post 241, in a preferred embodiment, at least one limit slot 131 is disposed on the receiving portion 13 to correspond in position to the at least one support post 241 so that an end of the at least one support post 241 can be inserted. In a preferred embodiment, a conductive material is disposed at the positioning slot 221, the limit slot 131, or the receiving portion 13, such that the conductive material can fill the interspace for improving the heat conductivity.

In the present embodiment, at least one metallic conductive post 25 is further disposed between the assembling portion 22 plane and the receiving portion 13 plane, such that the heat conductivity of the heat-dissipating base 10 and heat conductive metal block 20 can be increased. Since the difference of metallic conductive post 25 and support post 241 is merely that no resilient component 242 is disposed on the conductive post 25, the present paragraph dose not repeat describe the disposing structure of metallic conductive post 25.

Embodiment 2

Figure 5:
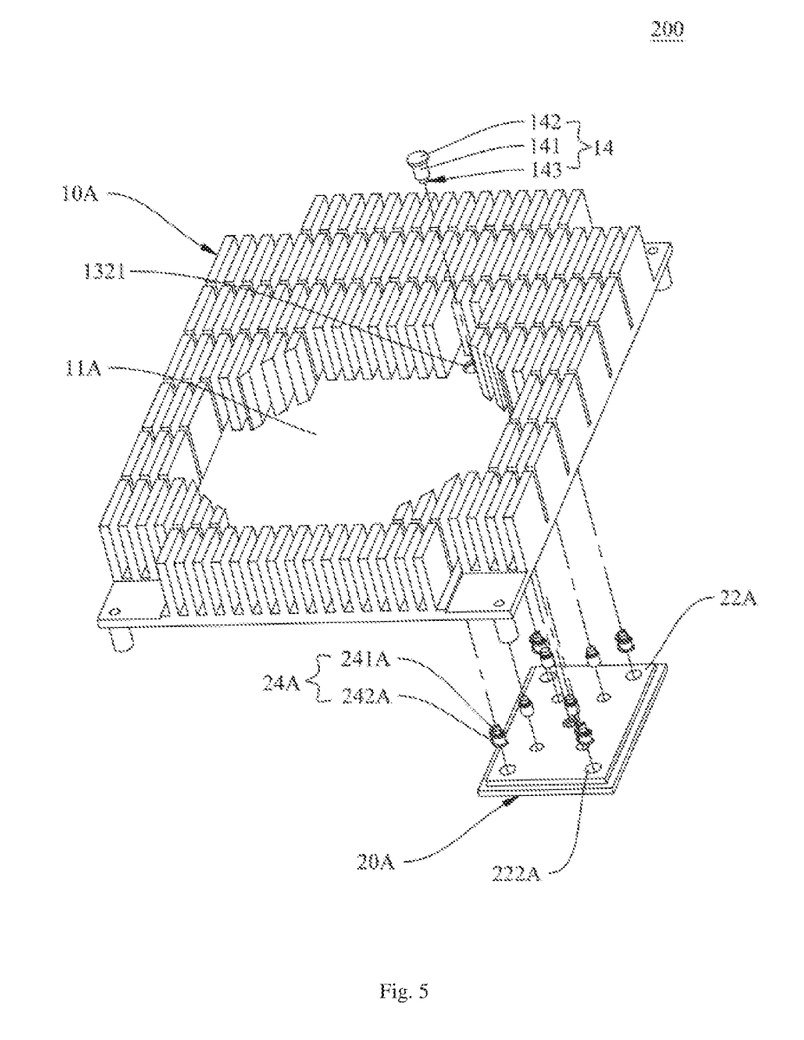
FIG. 5 shows the exploded perspective view (1) of the heat dissipator in another embodiment of the present invention.
Figure 6:
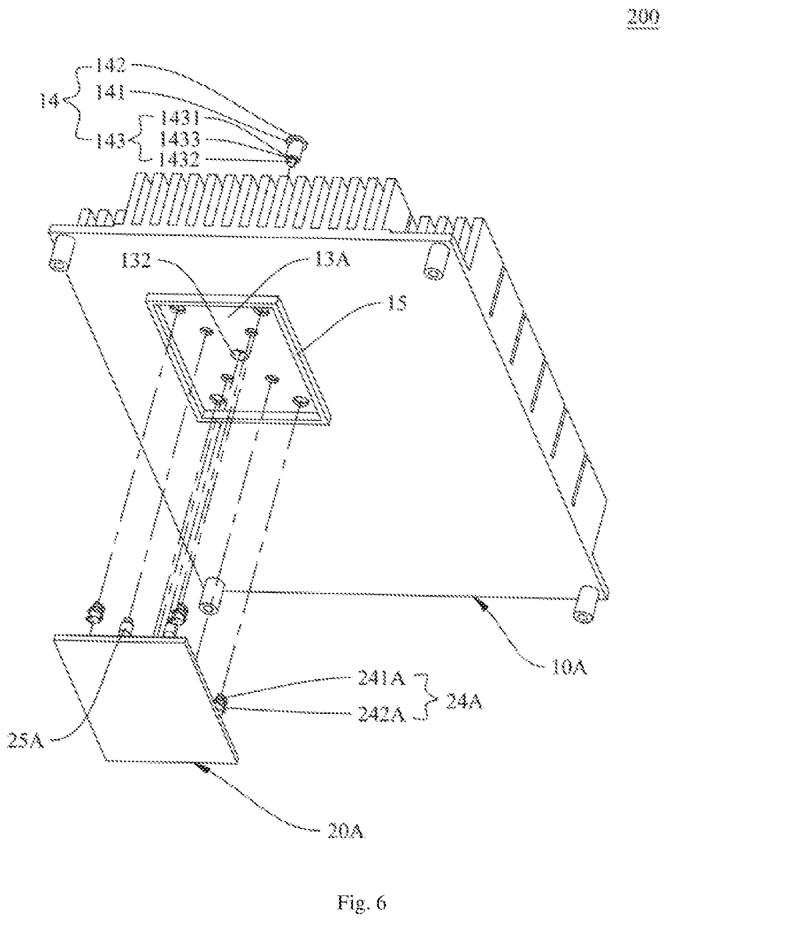
FIG. 6 shows the exploded perspective view (2) of the heat dissipator in another embodiment of the present invention.

Please refer to FIG. 5 and FIG. 6. The difference of present embodiment to the previous embodiment is merely the position relationship of resilient unit and heat-dissipating structure. Thus, the following only describes about the difference structure part without repeating description of the same structure part.

The present embodiment discloses a heat-dissipator structure 200, mainly comprising: a heat-dissipating base 10A and a conductive metal block 20A; a receiving portion 13A is disposed on a substrate 11A of the heat-dissipating base 10A; the conductive metal block 20 includes a assembling portion 22A, which is disposed on the receiving portion 13A. At least one resilient unit 24A is disposed between the assembling portion 22A plane and receiving portion 13A plane, and the resilient unit 24A includes at least one unpenetrable object means disposed on the receiving portion 13A, at least one support post 241A, and at least one resilient component 242A disposed on the support post 241A. An end of the support post 241A is disposed at the unpentrable object means of the receiving portion 13A. In a preferred embodiment, at least one limit slot 222A is disposed on the assembling portion 22A to correspond in position to the at least one support post 241A and so that an end of the at least one support post 241A can be inserted. In a preferred embodiment, the limit slot 222A or the receiving portion 13 disposes conductive material such that the conductive material can fill the interspace of the structure to enhance the heat conductivity.

In the present embodiment, at least one metallic conductive post 25A is further disposed between assembling portion 22A plane and receiving portion 13A plane, such that the heat conductivity of the heat-dissipating base 10A and the conductive metal block 20A can be enhanced. Since the difference of metallic conductive post 25A and support post 241A is merely that no resilient component 242A is disposed on the conductive post 25A, the present paragraph dose not repeat describe the disposing structure of metallic conductive post 25A.

The following is for describing the disposing structure of the limit sliding block; however, the embodiment of the present invention has no limitation by the following embodiment.

Figure 7:
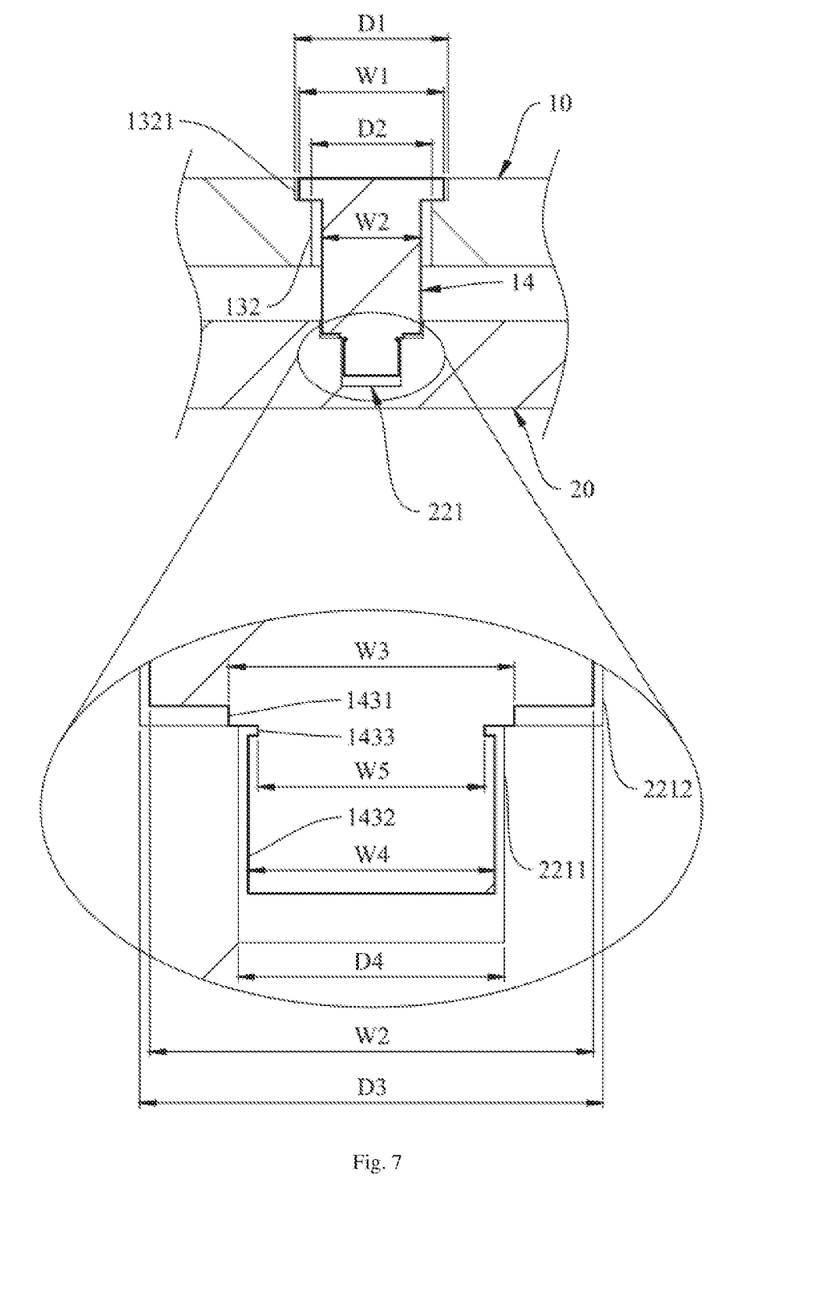
FIG. 7 shows the partial sectional view of before the limit sliding block riveted of the present invention.
Figure 8:
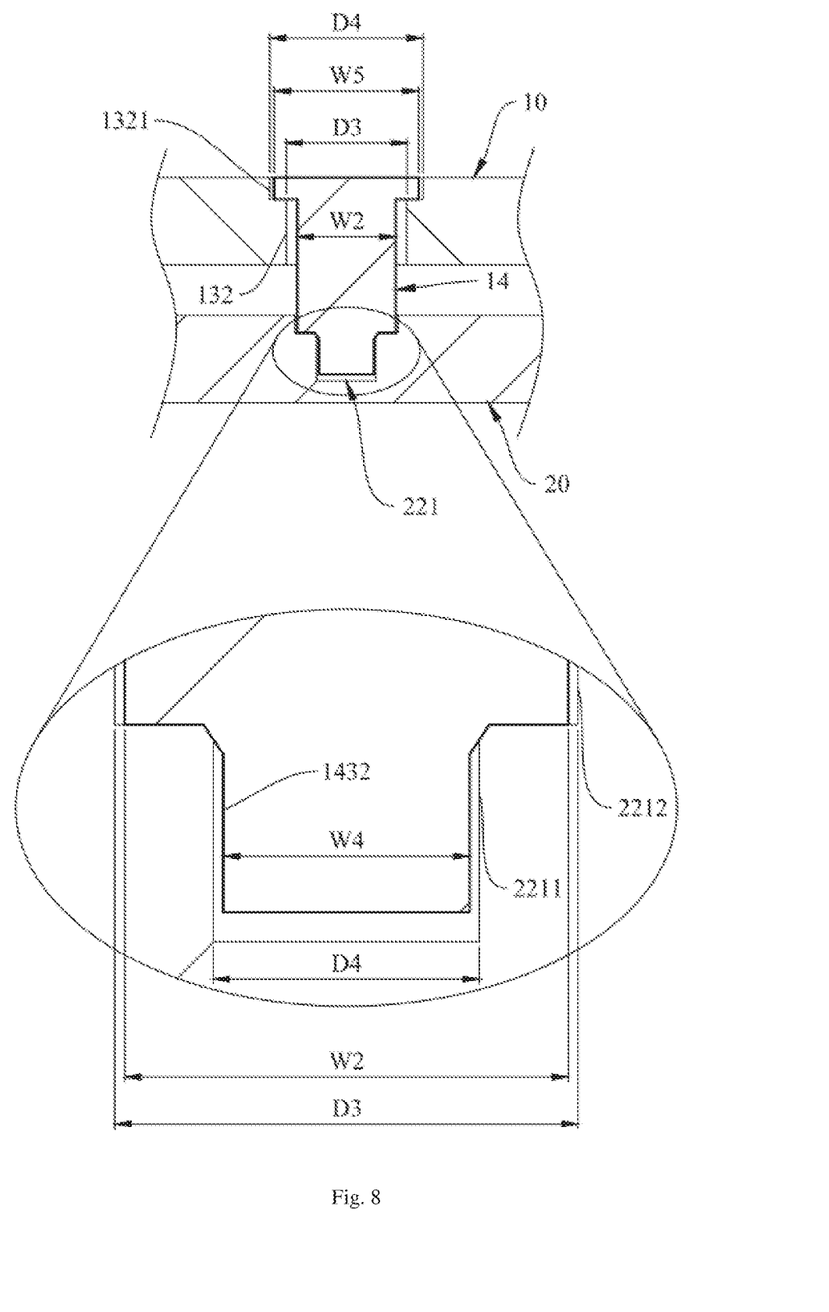
FIG. 8 shows the partial sectional view of after the limit sliding block riveted of the present invention.

Please refer to FIG. 7 and FIG. 8, which are respectively represented the exploded schematic view of before and after the limit sliding block riveted of the present invention, as show:

FIG. 7 demonstrates, in the present invention, the heat-dissipating base 10 includes a through hole 132 disposed on the receiving portion 13, and the limit sliding block 14 includes a sliding block body 141, a top protrusion portion 142 disposed on the sliding block body 141, and a riveting portion 143 disposed on the sliding block body 141 to face away the riveting portion 143. The sliding block body 141 of the limit sliding block 14 passes through the through hole 132; further, the limit sliding block 14 is limited on a side of the base 11 by the top protrusion portion 142 and riveted into the positioning slot 221 by the riveting portion 143, so that the limit sliding portion 14 limits the moving range of the conductive metal block 20 relative to the heat-dissipating base 10. In a preferred embodiment: an outer diameter W2 of the sliding block body 141 is slightly smaller than an inner diameter D2 of the through hole 132 such that the sliding block body 141 can pass through the through hole 132; an abutting recess 1321 is disposed on a side of the through hole 132 of the heat-dissipating base 10; the outer diameter W1 of the top protrusion portion 142 is between the inner diameter D1 of the abutting recess 1321 and the inner diameter D2 of the through hole 132, such that the abutting recess 1321 can engage with the top protrusion portion 142.

In the present invention, the positioning slot 221 includes a fixing recess 2211 and an external circumferential recess 2212. The external circumferential recess 2212 is disposed on the fixing recess 2211, and an inner diameter D3 of the external circumferential recess 2211 is relatively larger than the inner diameter D4 of fixing recess 2211. In a preferred embodiment, the riveting portion 143 includes a deforming segment 1431 and a position segment 1432. An outer diameter W3 of the deforming segment 1431 is between an inner diameter D3 of the external circumferential recess 2212 and an inner diameter D4 of the position segment 1432, such that the fixing recess 2211 can form an interfere. An outer diameter W4 of the position segment 1432 is smaller than the inner diameter D4 of the fixing recess 2211 so as to be inserted into the fixing recess 2211.

In the preferred embodiment, an annular groove 1433 is disposed between the deforming segment 1433 and the positioning segment 1432 and opened outward. The outer diameter W5 of the annular groove 1433 is relatively smaller than the outer diameter W4 of the positioning segment 1432, which provide the deforming space for the deforming segment 1431 riveting into the fixing recess 2211. As FIG. 8 shown, when the limit sliding block 14 rivets into the conductive metal block 20, the interfere portion formed by the deforming segment 1431 and the fixing recess 2211 will be deformed and tilted because of the riveting force; the deforming space can be provided by the annular groove 1433 so that the limit sliding block 14 can be disposed on the conductive metal block 20.

Figure 9:
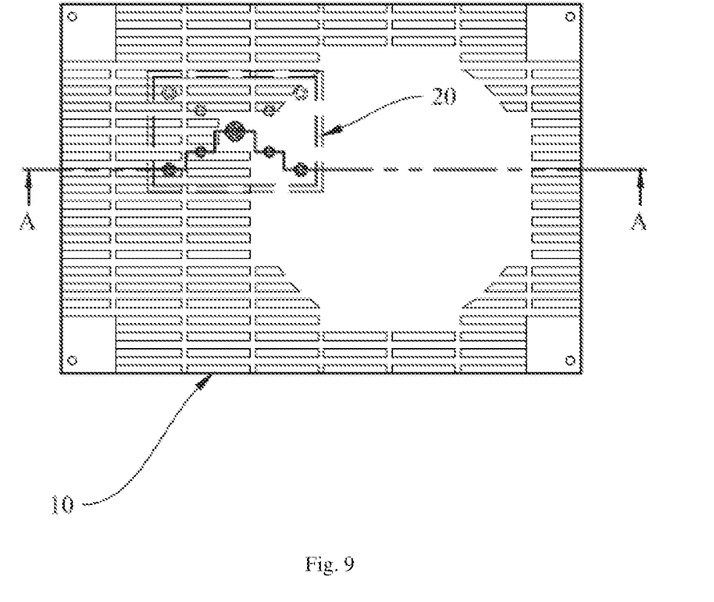
FIG. 9 shows overlook view of the heat dissipator of the present invention.
Figure 10:
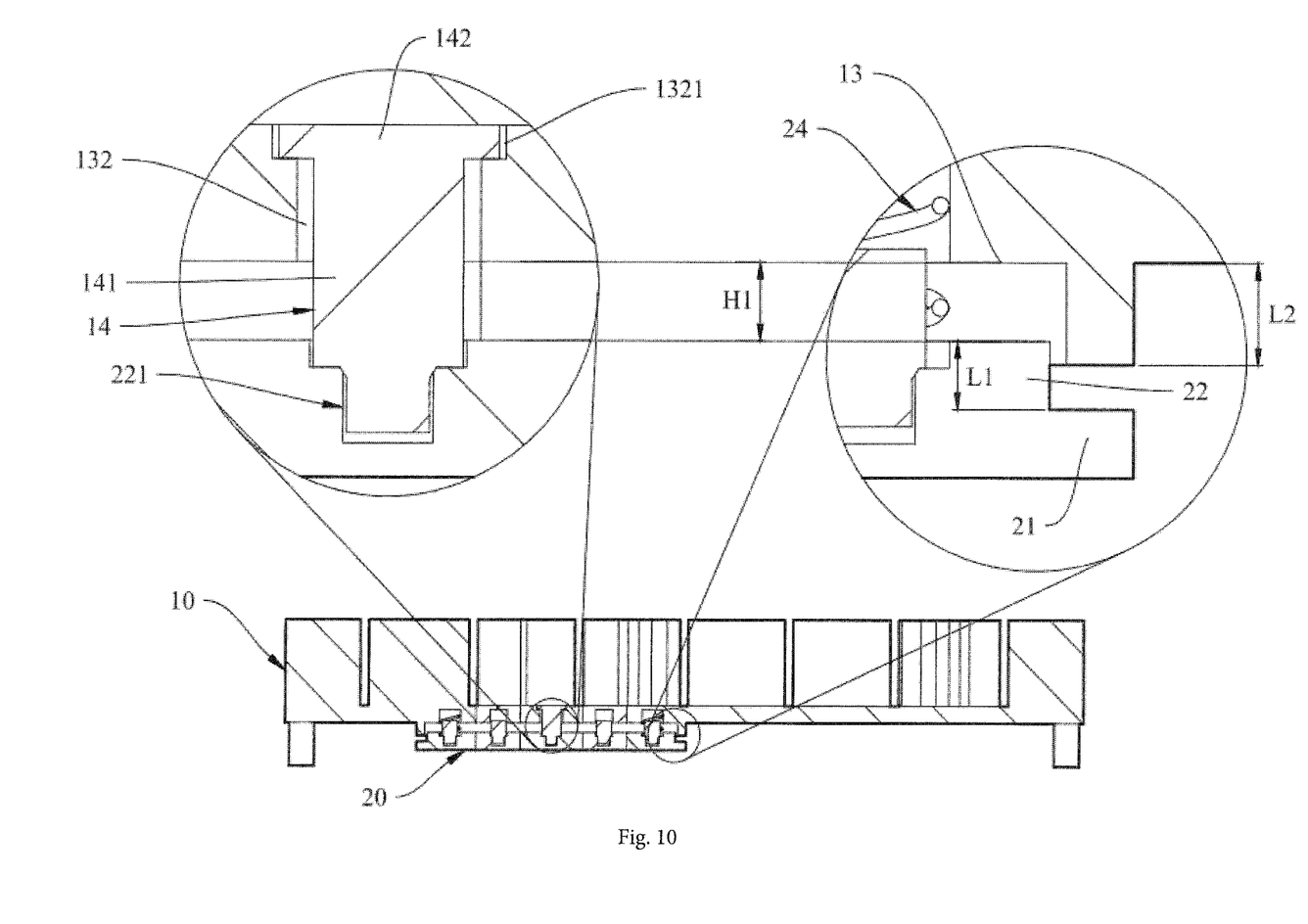
FIG. 10 shows A-A sectional view of the heat dissipator before the elastical adjustment of the present invention.

The following describes about movement limitation for the conductive metal block relative to the heat dissipating base. Please refer to FIG. 9 to FIG. 11, which are the schematic diagrams of overlook view and A-A section view of moving back and forth for the heat dissipator structure in the present invention. As FIG. 10 shown, the lower limitation of movement for the heat-dissipating base 10 depends on the length of the sliding block body 141; the depth of sliding block body 141 minus the positioning slot 221 and the depth of the through hole 132 obtains the largest space H1 between the heat-dissipating base 10 and the conductive metal block 20.

Figure 11:
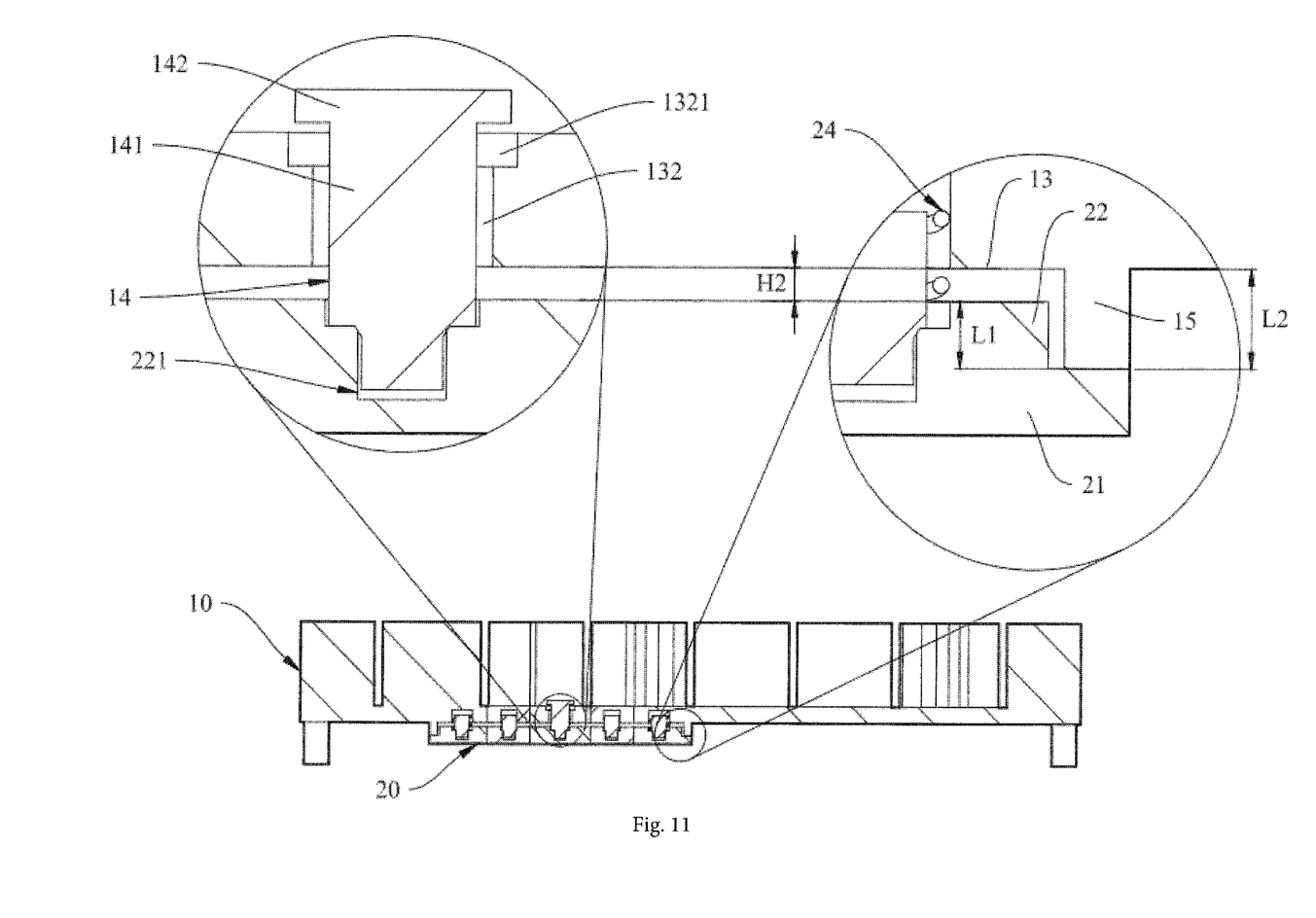
FIG. 11 shows A-A sectional view of the eat dissipator after the elastical adjustment of the present invention.

As FIG. 11 shown, the upper limitation of the movement for the heat-dissipating base 10 depends on the length of a second level difference L2 of an enclosing wall 15. During designing, when the second level difference L2 of the enclosing wall 15 is larger than the first level difference L1 of the assembling portion 22, the second level difference L2 minus the first level difference L1 obtains the smallest space H2 between the heat-dissipating base 10 and the conductive metal block 20. When second level difference L2 of the enclosing wall 15 is smaller than the first level difference L1 of the assembling portion 22, the space between the heat-dissipating base 10 and the conductive metal block 20 is 0.

The level difference of the largest space H1 and the smallest space H2 (or 0) is the movement range or the conductive metal block 20, which is convenient for the structure engineer to calculate the height of the support during designing.

The following is the structure actuator during assembling:

Before assembling, the resilient unit 24 is not under pressure and the conductive metal block 20 is in the condition of not moving toward the side of the heat-dissipating base 10. The top protrusion portion 142 of the limit sliding block 14 is disposed at the top of the abutting recess 1321, and the side of the limit sliding block 14 relative to the abutting recess 1321 is protruding the receiving portion 13 plane of the heat-dissipating base 10; at the same time, between the receiving portion 13 plane and the assembling portion has the largest space H1.

During assembling, the resilient unit 24 is under pressure and the conductive metal block 20 is in the condition of moving toward the side of the heat-dissipating base 10. The limit sliding block 14 of the top protrusion portion 142 is not disposed at the top of the abutting recess 1321 and protrudes the heat-dissipating base 10 plane. The movement range of the conductive metal block 20 relative to the heat-dissipating base 10 cannot exceed the level difference of the largest space H1 and the smallest space H2(or 0).

To sum up, the present invention utilizes riveting the limit sliding block to fix the conductive metal block on the heat-dissipating base, for keeping the metal sheet flat and avoiding the problem of damaging electronic components.

Moreover, the present invention utilizes the arrangement of the limit sliding block and the resilient unit to let the heat dissipation plane contact the electronic components, for increasing the contacting area of the heat dissipation plane and the electronic components to reduce the problem of tolerance.

The above mentioned has already described in detail for the present invention; however, the above mentioned are merely the preferred embodiments of the present invention and has no limitation to the implement of the present invention. Thus, any equivalent alternation and modification according to the claims of the present invention should be part of the claims of the present invention.

What is claimed is:

1. A heat dissipator structure, comprising:
a heat-dissipating base including a substrate and a plurality of heat-dissipating fins disposed on the substrate, wherein a receiving portion and a limit sliding block are disposed on the substrate, with the limit sliding block disposed on the receiving portion and movable within a restrictive interval; and
a conductive metal block including a body portion, an assembling portion disposed beside the body portion, and a heat dissipation plane disposed on the body portion to face away from the assembling portion and be in contact with an electronic component, with the assembling portion disposed on the receiving portion, an unpenetrable object means disposed on the assembling portion to hold the limit sliding block laterally to avoid penetration of the heat dissipation plane, and at least one resilient unit disposed between a plane on the assembling portion and a plane on the receiving portion, and surface area of the at least one resilient unit increases heat dissipation efficiency, wherein the conductive metal block is movable relative to the electronic component in a vertical direction parallel to the direction of a resilient force of the at least one resilient unit provided to the conductive metal block, and the at least one resilient unit provides the resilient force to press the conductive metal block into contact with the electronic component;
wherein the heat-dissipating base is disposed on the opposite side of the conductive metal block from the electronic component, and the unpenetrable object means is attached to the opposite side of the conductive metal block from the heat dissipation plane which is contacted to the electronic component;
wherein at least one metallic conductive post is disposed between the plane on the assembling portion and the plane on the receiving portion to enhance conductivity, and the two ends of the metallic conductive post are individually inserted into the heat-dissipating base and the conductive metal block.

2. The heat dissipator structure of claim 1, wherein the unpenetrable object means is a positioning slot for riveting the limit sliding block laterally.

3. The heat dissipator structure of claim 2, wherein the heat-dissipating base includes a through hole disposed on the receiving portion, whereas the limit sliding block includes a sliding block body adapted to pass through the through hole, a top protruding portion disposed at the sliding block body and confined to a side of the substrate, and a rivet end disposed on the sliding block body to face away from the top protruding portion and be riveted into the positioning slot.

4. The heat dissipator structure of claim 3, wherein an abutting recess is disposed on a side of the through hole of the heat-dissipating base to engage with the top protruding portion.

5. The heat dissipator structure of claim 3, wherein the positioning slot includes a fixing recess and an external circumferential recess disposed on the fixing recess and being of a larger inner diameter than the fixing recess, whereas the rivet end includes a deforming segment of an outer diameter less than the external circumferential recess but larger than the fixing recess to interfere with the fixing recess and a positioning segment of an outer diameter smaller than an inner diameter of the fixing recess so as to be inserted into the fixing recess.

6. The heat dissipator structure of claim 5, wherein an annular groove is disposed between the deforming segment and the positioning segment and opens outward to allow the deforming segment to be riveted into the fixing recess.

7. The heat dissipator structure of claim 1, wherein the at least one resilient unit includes at least one second unpenetrable object means disposed on the assembling portion, at least one support post with an end disposed at the at least one second unpenetrable object means, and at least one resilient component disposed on the at least one support post, respectively.

8. The heat dissipator structure of claim 7, wherein at least one limit slot is disposed on the receiving portion to correspond in position to the at least one support post and admit an end of the at least one support post, respectively.

9. The heat dissipator structure of claim 8, wherein a conductive material is disposed at the at least one second unpenetrable object means, the at least one limit slot, and/or the receiving portion.

10. The heat dissipator structure of claim 1, wherein the at least one resilient unit is disposed at least one of four corners of the conductive metal block.

11. The heat dissipator structure of claim 1, wherein the assembling portion is smaller than the body portion such that a first level difference is defined between the assembling portion and the body portion, wherein an enclosing wall is disposed at a periphery of the receiving portion to protrude relative to the receiving portion such that a second level difference is defined between the enclosing wall and the receiving portion, thereby allowing a position of the assembling portion to be limited by the first level difference and the second level difference jointly.

* * * * *